(12) United States Patent
Ryu (10) Patent No.: US 8,994,440 B2
(45) Date of Patent: Mar. 31, 2015

(54) VOLTAGE SELECT CIRCUIT AND INTERGRATED CIRCUIT INCLUDING THE SAME

(75) Inventor: Je Il Ryu, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 107 days.

(21) Appl. No.: 13/487,905

(22) Filed: Jun. 4, 2012

(65) Prior Publication Data

US 2013/0106491 A1 May 2, 2013

(30) Foreign Application Priority Data

Oct. 28, 2011 (KR) .................. 10-2011-0110971

(51) Int. Cl.
*H03K 17/00* (2006.01)
*G11C 8/08* (2006.01)
*G11C 16/08* (2006.01)

(52) U.S. Cl.
CPC ............... *H03K 17/005* (2013.01); *G11C 8/08* (2013.01); *G11C 16/08* (2013.01); *H03K 2217/0054* (2013.01)
USPC .......................................... 327/407; 327/408

(58) Field of Classification Search
CPC ... H03K 17/693; H03K 17/004; H03K 17/74; H03K 17/6257; H04J 3/047
USPC ........... 327/407, 408, 411; 348/294, 302–310
See application file for complete search history.

(56) References Cited

U.S. PATENT DOCUMENTS 5,070,255 A * 12/1991 Shin .............................. 327/408
7,397,020 B2 * 7/2008 Roh ........................... 250/208.1

FOREIGN PATENT DOCUMENTS

| KR | 1020030021647 A | 3/2003 |
| KR | 1020060019073 A | 3/2006 |

* cited by examiner

*Primary Examiner* — Diana J Cheng
(74) *Attorney, Agent, or Firm* — William Park & Associates Patent Ltd.

(57) ABSTRACT

A voltage select circuit includes a plurality of first transfer elements configured to transfer respective operating voltages to a first output terminal, a transfer select circuit unit configured to output a first voltage necessary to transfer an operating voltage, selected from among the operating voltages, to at least one first transfer element in response to a plurality of enable signals, and a control circuit configured to boost the first voltage to a second voltage in response to the plurality of enable signals.

19 Claims, 9 Drawing Sheets

VOLTAGE SELECT CIRCUIT AND INTERGRATED CIRCUIT INCLUDING THE SAME

CROSS-REFERENCE TO RELATED APPLICATION

The present application claims priority under 35 U.S.C. §119(a) to Korean patent application number 10-2011-0110971 filed, on Oct. 28, 2011, the entire disclosure of which is incorporated by reference herein.

BACKGROUND

1. Field of the Invention

Example embodiments relate to a voltage select circuit and an integrated circuit.

2. Related Art

A semiconductor memory device typically has both Random Access Memory (RAM) in and from which data can be freely written and erased and Read Only Memory (ROM) which can retain data even without supply of power, and thus ROM has recently being widely adopted as the storage media of portable electronic devices, such as mobile phone, digital cameras, Personal Digital Assistants (PDAs), and MP3 players.

Memory cells of a semiconductor memory device are coupled to word lines and bit lines, and a particular memory cell is selected by selecting a word line and a bit line.

A program operation is performed on a page basis. Memory cells coupled to one word line correspond to at least one page. In order to perform a program operation, a program voltage is supplied to a word line selected for a program, and a pass voltage is supplied to the remaining word lines.

Here, the program voltage or the pass voltage is supplied to each word line via a global word line. Furthermore, the global word lines are coupled to a voltage supply unit of a non-volatile memory device and are supplied with voltages necessary for program and other operations.

The voltages supplied to the global word lines are determined in response to a control signal inputted to a control unit for controlling operation of the semiconductor memory device. That is, in response to the control signal, a program voltage is supplied to a global word line coupled to a selected word line and the pass voltage is supplied to global word lines coupled to the remaining word lines. To this end, the control unit performs control functions so that a circuit for generating various voltages can generate the various voltages, and the generated voltages can be supplied to the global word lines.

Meanwhile, in the program operation of the semiconductor memory device, a local self-boosting method of supplying voltage is used in the program operation, in various levels, in order to prevent threshold voltages of memory cells unselected for a program from being shifted.

If types of the voltages supplied to the global word lines are diversified, the number of control signals generated from the control unit in order to set the types of the voltages necessary for the respective global word lines is also increased. Furthermore, the area of the circuits of the semiconductor memory device may be increased because the number of circuits for selecting one of the voltages is increased.

BRIEF SUMMARY

Example embodiments relate to a voltage select circuit capable of reducing the number of high voltage switches included in a circuit for selecting one of operating voltages and an integrated circuit including the voltage select circuit.

A voltage select circuit according to an aspect of the present disclosure includes a plurality of first transfer elements configured to transfer respective operating voltages to a first output terminal, a transfer select circuit unit configured to output a first voltage necessary to transfer an operating voltage, selected from among the operating voltages, to at least one first transfer element in response to a plurality of enable signals, and a control circuit configured to boost the first voltage to a second voltage in response to the plurality of enable signals.

An integrated circuit according to another aspect of the present disclosure includes internal circuits operated in response to an operation control signal and respective operating voltages selected from among a plurality of operating voltages; and voltage select circuits coupled to respective internal circuits and configured to select the operating voltages to be supplied to the respective internal circuits in response to the plurality of operating voltages and a plurality of enable signals. Here, each of the voltage select circuits includes a plurality of first transfer elements configured to transfer the respective operating voltages to a first output terminal coupled to the internal circuits; a transfer select circuit unit configured to output a first voltage for transferring an operating voltage, selected from among the plurality of operating voltages, to the first transfer element which transfers the selected operating voltage in response to a plurality of enable signals; and a control circuit configured to boost the first voltage to a second voltage in response to the plurality of enable signals.

A voltage select circuit according to another embodiment comprises a transfer select circuit configured to receive a plurality of enable signals and output a first voltage necessary to transfer an operating voltage a first output terminal, where the operating voltage is selected from among a plurality of operating voltages, and the operating voltage is selected based on the plurality of enable signals.

DESCRIPTION OF EMBODIMENTS

Hereinafter, embodiments of the present disclosure will be described in detail with reference to the accompanying drawings. The figures are provided to allow those having ordinary skill in the art to understand the scope of the embodiments of the disclosure.

Figure 1A:
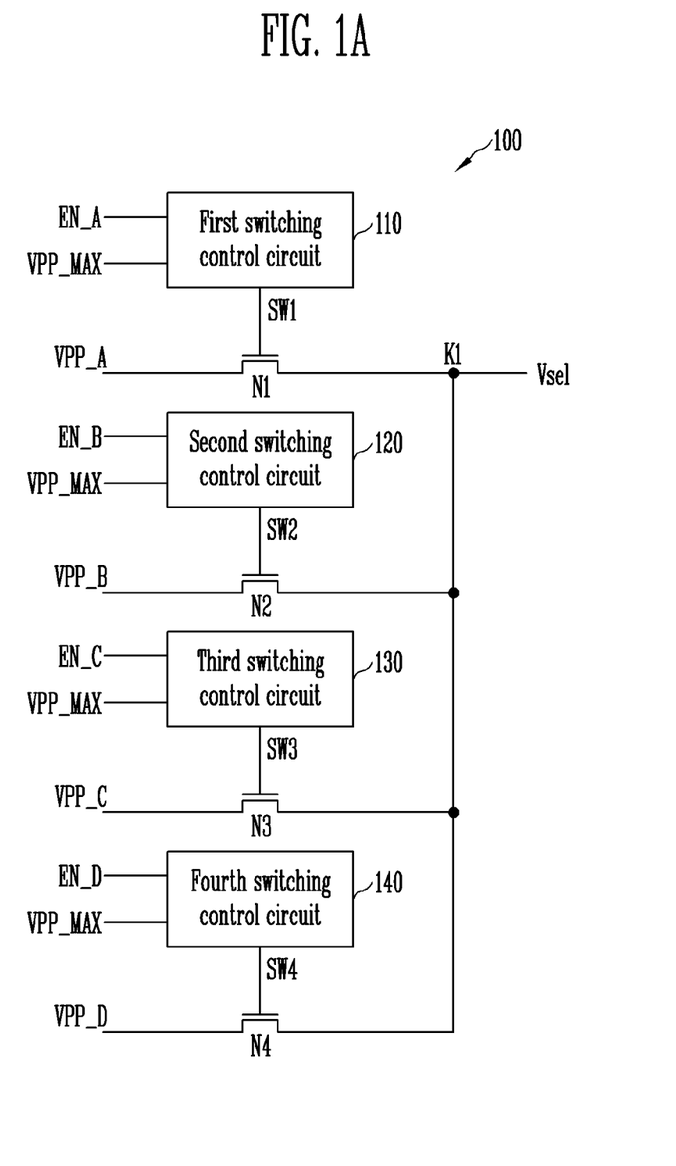
FIG. 1A shows a voltage select circuit according to an embodiment of this disclosure.

FIG. 1A shows a voltage select circuit according to an embodiment of this disclosure.

In FIG. 1A, the voltage select circuit 100 for selecting one of first to fourth voltages VPP_A to VPP_D is shown as a representative example.

Referring to FIG. 1A, the voltage select circuit 100 includes first to fourth switching control circuits 110 to 140 and first to fourth NMOS transistors N1 to N4.

The first to fourth NMOS transistors N1 to N4 function to transfer high voltages. Each of the first to fourth NMOS transistors N1 to N4 is turned on when a high voltage is supplied to a gate of each of the first to fourth NMOS transistors N1 to N4. In an embodiment, each of the first to fourth NMOS transistors N1 to N4 is turned on when a fifth voltage VPP_MAX is supplied to each of the first to fourth NMOS transistors N1 to N4.

The first to fourth switching control circuits 110 to 140 receive first to fourth enable signals EN_A to EN_D, respectively, and the fifth voltage VPP_MAX. Furthermore, the first to fourth switching control circuits 110 to 140 output first to fourth switching control signals SW1 to SW4, respectively.

For example, the first switching control circuit 110 receives the first enable signal EN_A and the fifth voltage VPP_MAX and outputs the first switching control signal SW1 in response to the first enable signal EN_A and the fifth voltage VPP_MAX.

The first to fourth NMOS transistors N1 to N4 are coupled between respective input terminals and a node K1, where the first to fourth voltages VPP_A to VPP_D are inputted to the respective input terminals. A select voltage Vsel is outputted through the node K1.

The first to fourth switching control signals SW1 to SW4 are inputted to respective gates of the first to fourth NMOS transistors N1 to N4. For example, the first switching control signal SW1 is inputted to the gate of the first NMOS transistor N1.

The first to fourth switching control circuits 110 to 140 output the first to fourth switching control signals SW1 to SW4 in response to the first to fourth enable signals EN_A to EN_D, respectively. Accordingly, one of the first to fourth voltages VPP_A to VPP_D is outputted through the node K1.

The first to fourth switching control circuits 110 to 140 may have a substantially similar construction, and thus only the first switching control circuit 110 is described as an example.

Figure 1B:
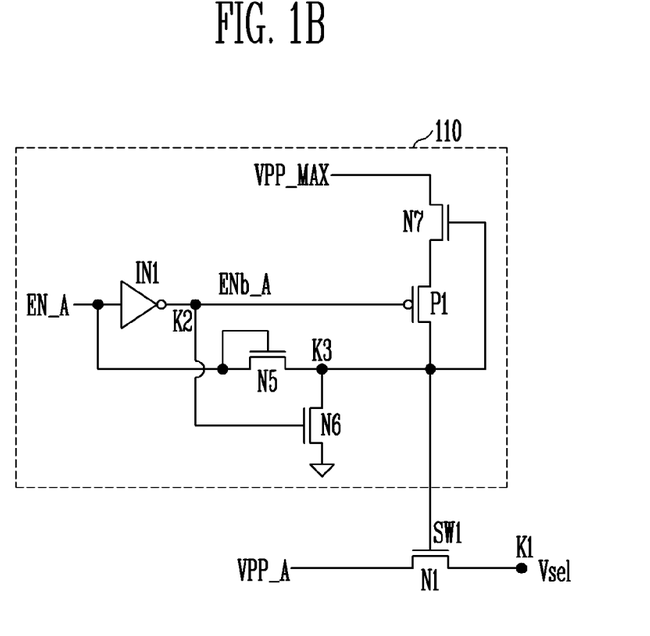
FIG. 1B is a detailed circuit diagram of a first switching control circuit of FIG. 1A.

FIG. 1B is a detailed circuit diagram of the first switching control circuit 110 of FIG. 1A.

Referring to FIG. 1B, the first switching control circuit 110 includes a first inverter IN1, fifth to seventh NMOS transistors N5 to N7, and a first PMOS transistor P1.

The first inverter IN1 inverts the first enable signal EN_A and outputs an inverted enable signal ENb_A. The output terminal of the first inverter IN1 is coupled to a node K2 and the gate of the first PMOS transistor P1.

The fifth NMOS transistor N5 is coupled between an input terminal to which the first enable signal EN_A is inputted and a node K3, and it has a diode form having a gate and a drain coupled. Furthermore, the voltage level of the first switching control signal SW1 is determined depending on the voltage of the node K3.

The sixth NMOS transistor N6 is coupled between the node K3 and a ground node. The gate of the sixth NMOS transistor N6 is coupled to the node K2.

The seventh NMOS transistor N7 and the first PMOS transistor P1 are coupled in series between the node K4 and an input terminal to which the fifth voltage VPP_MAX is inputted. The gate of the seventh NMOS transistor N7 is coupled to the node K4.

The first switching control circuit 110 changes the voltage level of the first switching control signal SW1 in response to the first enable signal EN_A.

That is, when the first enable signal EN_A of a high level is received, the voltage of the node K2 becomes a low level. When the voltage of the node K2 is a low level, the sixth NMOS transistor N6 is turned off and the first PMOS transistor P1 is turned on.

Furthermore, the fifth NMOS transistor N5 is turned on in response to the first enable signal EN_A of a high level, and the first enable signal EN_A of a high level is transferred to the node K3.

When the first enable signal EN_A of a high level is supplied to the node K3, the seventh NMOS transistor N7 is turned on. Accordingly, the fifth voltage VPP_MAX is supplied to the node K3. That is, the first switching control signal SW1 has the same level as the fifth voltage VPP_MAX.

When the first switching control signal SW1 has the same level as the fifth voltage VPP_MAX, the first NMOS transistor N1 is turned on and the first voltage VPP_A is outputted to the node K1.

If the first enable signal EN_A of a low level is supplied to the node K3, the voltage of the node K2 becomes a high level. In response thereto, the sixth NMOS transistor N6 is turned on. When the sixth NMOS transistor N6 is turned on, the node K3 is coupled to the ground node. Furthermore, since the voltage of the node K2 is a high level, the first PMOS transistor P1 is turned off.

Accordingly, the first switching control signal SW1 having same level as the ground voltage is supplied, and thus the first NMOS transistor N1 remains turned off.

The second to fourth switching control circuits 120 to 140 operate like the first switching control circuit 110. The voltage select circuit 100 selects one of the first to fourth voltages VPP_A to VPP_D and outputs the selected voltage to the node K1. Accordingly, only one of the first to fourth enable signals EN_A to EN_D has to be supplied at a high level.

The voltage select circuit 100, such as that shown in FIG. 1A, must include the same number of switching control circuits as received operating voltages. Furthermore, only one of the switching control circuits is used for outputting voltage selected in response to the switching control signal.

The voltage select circuit 100 is implemented as an integrated circuit. The number of switching control circuits included in the voltage select circuit 100 must be increased according to an increase in the types of operating voltages used in the integrated circuit. It means that the area occupied by the voltage select circuit 100 is increased. Consequently, the entire circuit area of the integrated circuit may be increased.

Figure 2:
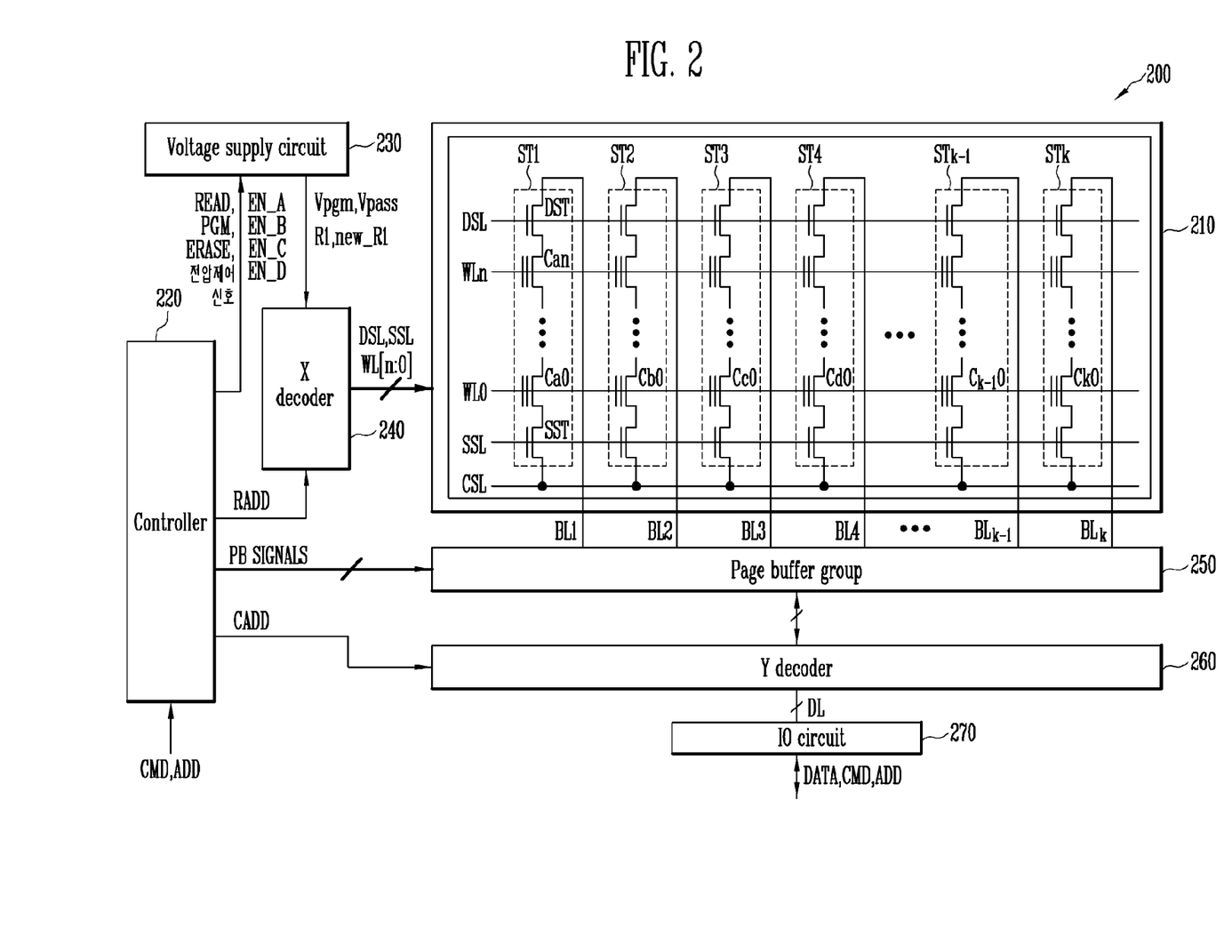
FIG. 2 shows a semiconductor memory device according to an embodiment of this disclosure.

FIG. 2 shows a semiconductor memory device according to an embodiment of this disclosure.

Referring to FIG. 2, the semiconductor memory device 200 includes a memory array 210, an operation circuit group (230, 240, 250, 260, and 270) configured to perform a program operation or a read operation for the memory cells of the memory cell array 210, and a controller 220 configured to control the operation circuit group (230, 240, 250, 260, and 270).

The operation circuit group includes a voltage supply circuit 230, an X decoder 240, a page buffer group 250, a Y decoder 260, and an I/O circuit 270.

The memory cell array 210 includes a plurality of memory blocks. Only one of the memory blocks is shown in FIG. 2 for simplicity. The memory block includes a plurality of strings ST1 to STk. Each (e.g., ST1) of the strings includes a source select transistor SST coupled to a common source line CSL, a plurality of memory cells Ca0 to Can, and a drain select transistor DST coupled to a bit line BL1. The gate of the source select transistor SST is coupled to a source select line SSL, the gates of the memory cells Ca0 to Can are coupled to respective word lines WL0 to WLn, and the gate of the drain select transistor DST is coupled to a drain select line DSL. The strings ST1 to STk are coupled to the respective bit lines BL1 to BLk and are in common coupled to the common source line CSL.

The memory block may be divided into physical pages and logical pages. A page (or an even page or an odd page) is a basic unit for a program operation or a read operation.

For example, the memory cells Ca0 to Ck0 coupled to one word line (e.g., WL0) may form one physical page. Here, the even-numbered memory cells Ca0, Cc0 to Ck-10 coupled to the word line WL0 may form an even physical page, and the odd-numbered memory cells Cb0, Cd0 to Ck0 coupled to the word line WL0 may form one odd physical page.

The controller 220 internally generates a program operation signal PGM, a read operation signal READ, or an erase operation signal ERASE in response to an external command signal CMD and generates control signals PB SIGNALS for controlling page buffers of the page buffer group 250 according to a type of an operation. The controller 220 internally generates a row address signal RADD and a column address signal CADD in response to an address signal ADD. Furthermore, the controller 220 generates enable signals EN_A, EN_B, EN_C, and EN_D for selecting operating voltages, from among operating voltages generated from the voltage supply circuit 230, to be supplied to global word lines.

In FIG. 2, the controller 220 is illustrated to output the four enable signals EN_A, EN_B, EN_C, and EN_D, but the number of enable signals may be increased if the types of the operating voltages are increased.

The voltage supply circuit 230 generates operating voltages (e.g., Vpgm, Vpass, R1, and new_R1) for programming, reading, and erasing the memory cells in response to the internal command signals PGM, READ, and ERASE of the controller 220, and voltage supply circuit 230 selects one of the operating voltages to be supplied to each global line in response to the control signal of the controller 220.

The voltage supply circuit 230 includes the voltage select circuit 100, such as that shown in FIG. 1A. The voltage supply circuit 230 selects one of the operating voltages and supplies the selected operating voltage to each global line.

The X decoder 240 transfers the selected operating voltage of the voltage supply circuit 230 to the local lines DSL, WL[n:0], and SSL of a memory block, selected from among the memory blocks of the memory array 210, in response to the row address signals RADD of the controller 220.

The page buffer group 250 includes the page buffers (not shown) coupled to the respective bit lines BL1 to BLk. The page buffer group 250 supplies the bit lines BL1 to BLk with voltages necessary to store data in the memory cells Ca0 to Ck0 in response to the control signals PB SIGNALS received from the controller 220. More specifically, in the program operation, the erase operation, or the read operation of the memory cells Ca0 to Ck0, the page buffer group 250 precharges the bit lines BL1 to BLk or latches data corresponding to the threshold voltages of the memory cells Ca0 to Ck0 which are detected according to changes in the voltages of the bit lines BL1 to BLk. That is, the page buffer group 250 controls the voltages of the bit lines BL1 to BLk depending on the data stored in the memory cells Ca0 to Ck0 and detects data stored in the memory cells Ca0 to Ck0.

The Y decoder 260 selects the page buffers of the page buffer group 250 in response to the column address signal CADD of the controller 220. Data latched in the page buffers selected by the Y decoder 260 is outputted.

The I/O circuit 270 transfers external data to the Y decoder 260 under control of the controller 220 so that the external data is inputted to the page buffer group 250 in a program operation. When the external data is sequentially transferred to the page buffers of the page buffer group 250, the page buffers latch the external data in their internal latches. Furthermore, in a read operation, the I/O circuit 270 externally outputs data received from the page buffers of the page buffer group 250 via the Y decoder 260.

The voltage supply circuit 230 is described in more detail below.

Figure 3:
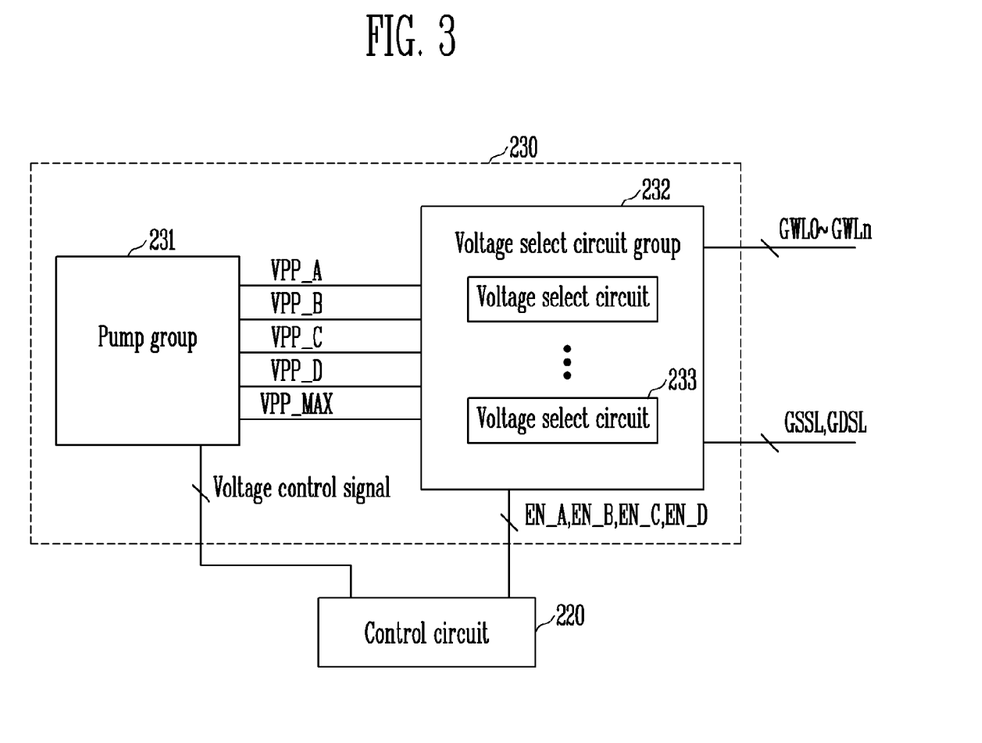
FIG. 3 is a detailed circuit diagram of a voltage supply circuit of FIG. 2.

FIG. 3 is a detailed circuit diagram of the voltage supply circuit 230 of FIG. 2.

Referring to FIG. 3, the voltage supply circuit 230 includes a pump group 231 and a voltage select circuit group 232.

The pump group 231 includes pumps for generating operating voltages in response to a voltage control signal generated from the controller 220.

The voltage select circuit group 232 includes voltage select circuits 233, such as that shown in FIG. 1A. The voltage select circuits 233 are coupled to respective global lines (e.g., global word lines GWL0 to GWLn and global select lines GSSL and GDSL).

That is, each of the voltage select circuits 233 configured as shown in FIGS. 1A and 1B selects one of the first to fourth voltages VPP_A to VPP_D in response to each of the first to fourth enable signals EN_A to EN_D and outputs the selected voltage to the global lines.

If the voltage select circuit 233 has the same construction as the voltage select circuit 100 of FIG. 1, the number of switching control circuits used in each of the voltage select circuits 233 (or 100 of FIG. 1A) is increased and the size of the circuit is greatly increased as types of the operating voltages used in the semiconductor memory device 200 are increased.

In order to prevent this problem, in an embodiment of this disclosure, the voltage select circuit 233 is configured as follows.

Figure 4A:
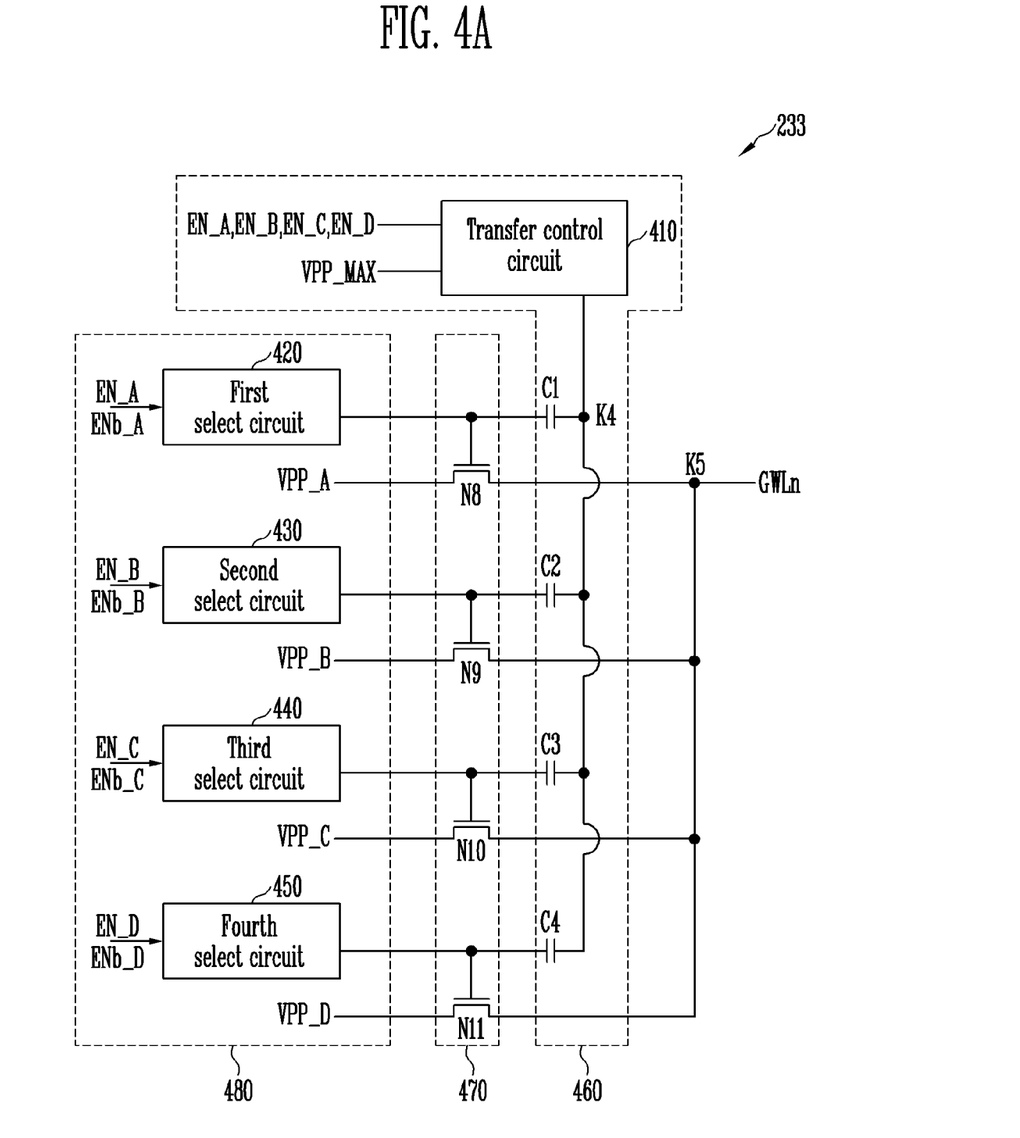
FIG. 4A shows a voltage select circuit according to an embodiment of this disclosure.

FIG. 4A shows a voltage select circuit 233 according to an embodiment of this disclosure.

FIG. 4A shows an example in which the voltage select circuit 233 according to an embodiment of this disclosure is applied to the semiconductor memory device 200 of FIG. 2. Here, types of voltages and types of control signals may change depending on a type of an integrated circuit within which the voltage select circuit 233 operates.

Referring to FIG. 4A, the voltage select circuit 233 includes a transfer control circuit 410, first to fourth select circuits 420 to 450, first to fourth capacitors C1 to C4, and eighth to 11$^{th}$ NMOS transistors N8 to N11.

The voltage select circuit 233 further includes a first control circuit 460. The first control circuit 460 includes the transfer control circuit 410 and the first to fourth capacitors C1 to C4 in order to control an operation of transferring a selected voltage to a voltage output terminal (e.g., a global word line GWLn).

The eighth to 11$^{th}$ NMOS transistors N8 to N11 form a transfer transistor 470 for transferring one of first to fourth voltages VPP_A to VPP_D to the global word line GWLn.

Furthermore, the first to fourth select circuits 420 to 450 form a select circuit group 480 that outputs a select voltage for selecting one of the first to fourth voltages VPP_A to VPP_D in response to first to fourth enable signals EN_A to EN_D.

The eighth to 11$^{th}$ NMOS transistors N8 to N11 transfer one of the first to fourth voltages VPP_A to VPP_D to the global word line GWLn depending on the select voltage and voltage provided by the first control circuit 460.

The transfer control circuit 410 supplies a fifth voltage VPP_MAX or a ground voltage to a node K4 in response to the fifth voltage VPP_MAX and first to fourth enable signals EN_A to EN_D.

The first capacitor C1 is coupled between the node K4 and the gate of the eighth NMOS transistor N8. The second capacitor C2 is coupled between the node K4 and the gate of the ninth NMOS transistor N9.

The third capacitor C3 is coupled between the node K4 and the tenth NMOS transistor N10. The fourth capacitor C4 is coupled between the node K4 and the 11$^{th}$ NMOS transistor N11.

Furthermore, the first select circuit 420 supplies a voltage VDD–Vth or the ground to the gate of the eighth NMOS transistor N8 in response to the first enable signal EN_A. When the first select circuit 420 removes the voltage VDD–Vth supplied to the gate of the eighth NMOS transistor N8, the first voltage VPP_A is selected.

The eighth NMOS transistor N8 is coupled between the input terminal of the first voltage VPP_A and a node K5. The node K5 is coupled to the global word line GWLn.

The second select circuit 430 supplies the voltage VDD–Vth or the ground to the gate of the ninth NMOS transistor N9 in response to the second enable signal EN_B.

The ninth NMOS transistor N9 is coupled between the input terminal of the second voltage VPP_B and the node K5.

The third select circuit 440 supplies the voltage VDD–Vth or the ground to the gate of the tenth NMOS transistor N10 in response to the third enable signal EN_C.

The tenth NMOS transistor N10 is coupled between the input terminal of the third voltage VPP_C and the node K5.

The fourth select circuit 450 supplies the voltage VDD–Vth or the ground to the gate of the 11$^{th}$ NMOS transistor N11 in response to the fourth enable signal EN_D.

The 11$^{th}$ NMOS transistor N11 is coupled between the input terminal of the fourth voltage VPP_D and the node K5.

The transfer control circuit 410 is configured as follows.

Figure 4B:
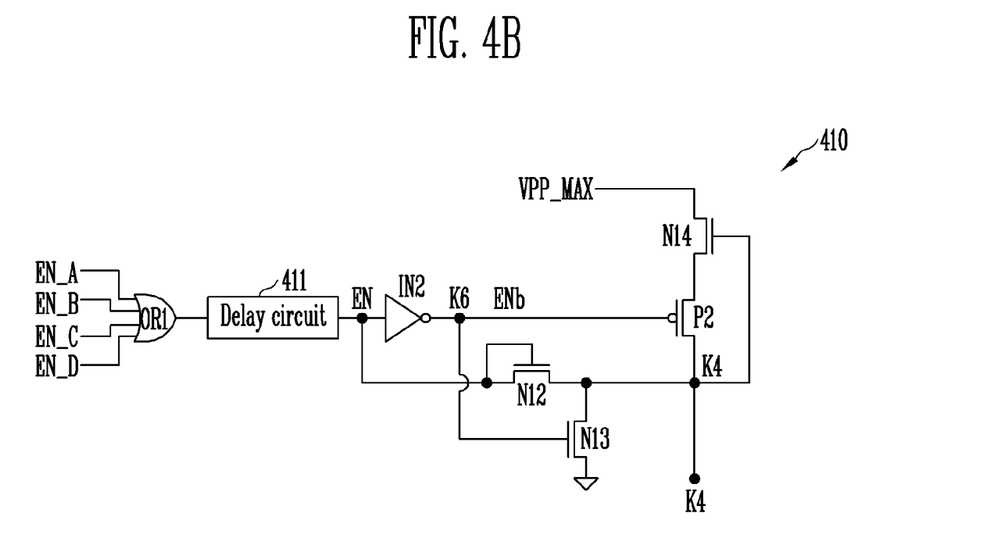
FIG. 4B is a detailed circuit diagram of a transfer control circuit of FIG. 4A.

FIG. 4B is a detailed circuit diagram of the transfer control circuit 410 of FIG. 4A.

Referring to FIG. 4B, the transfer control circuit 410 includes a first OR gate OR1, a second inverter IN2, a delay circuit 411, a second PMOS transistor P2, and 12$^{th}$ to 14$^{th}$ NMOS transistors N12 to N14.

The first OR gate OR1 receives the first to fourth enable signals EN_A to EN_D. If at least one of the first to fourth enable signals EN_A to EN_D is received with a high level, the first OR gate OR1 outputs an output signal of a high level. The output signal of the OR gate OR1 is delayed for a specific time period through the delay circuit 411.

The output signal of the delay circuit 411 is an enable signal EN.

The 12$^{th}$ to 14$^{th}$ transistors N12 to N14 and the second PMOS transistor P2 function as a voltage supply circuit for supplying the fifth voltage VPP_MAX to the node K4 or coupling the node K4 to the ground node in response to the enable signal EN.

The second inverter IN2 inverts the enable signal EN and outputs an inverted enable signal ENb. The second inverter IN2 is coupled to a node K6. The node K6 is coupled to the gate of the second PMOS transistor P2.

The 12$^{th}$ NMOS transistor N12 is coupled between the node K4 and the output terminal of the delay circuit 411 from which the enable signal EN is outputted. The 12$^{th}$ NMOS transistor N12 has a gate and a drain that is coupled between the node K4 and the output terminal of the delay circuit 411.

The 13$^{th}$ NMOS transistor N13 is coupled between the node K4 and the ground node, and the gate of the 13$^{th}$ NMOS transistor N13 is coupled to the node K6.

The 14$^{th}$ NMOS transistor N14 and the second PMOS transistor P2 are coupled in series between the node K4 and the input terminal of the fifth voltage VPP_MAX.

The gate of the 14$^{th}$ NMOS transistor N14 is coupled to the node K4.

When any one of the first to fourth enable signals EN_A to EN_D has a high level, the transfer control circuit 410 supplies the fifth voltage VPP_MAX to the node K4.

When any one of the first to fourth enable signals EN_A to EN_D has a high level, the first OR gate OR1 outputs a signal of a high level.

The output signal of the first OR gate OR1 is delayed for a specific time period by the delay circuit 411 and is then outputted as the enable signal EN. When any one of the first to fourth enable signals EN_A to EN_D has a high level, the enable signal EN of a high level is outputted.

Next, the enable signal EN of a high level is inverted by the second inverter IN2.

The 12$^{th}$ NMOS transistor N12 is turned on in response to the enable signal EN of a high level, and the 13$^{th}$ NMOS transistor N13 is turned off in response to the inverted enable signal ENb of a low level.

The second PMOS transistor P2 is turned on in response to the inverted enable signal ENb of a low level. The 14$^{th}$ NMOS transistor N14 is turned on in response to the enable signal EN of a high level which is transferred from the node K4, which received the enable signal EN of a high level from the 12$^{th}$ NMOS transistor N12.

Accordingly, the fifth voltage VPP_MAX is transferred to the node K4.

The first to fourth select circuits 420 to 450 shown in FIG. 4A have a substantially similar construction, and thus only the first select circuit 420 is described as an example below.

Figure 4C:
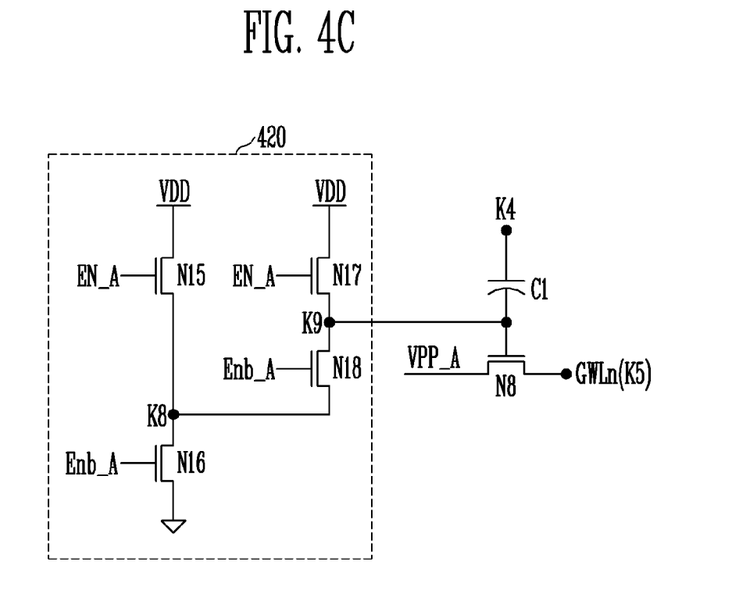
FIG. 4C shows a first select circuit of FIG. 4A.

FIG. 4C shows the first select circuit 420 of FIG. 4A.

Referring to FIG. 4C, the first select circuit 420 includes 15$^{th}$ to 18$^{th}$ NMOS transistors N15 to N18.

The 15$^{th}$ and the 16$^{th}$ NMOS transistors N15 and N16 are coupled in series between the input terminal of a power source voltage VDD and the ground node. The first enable signal EN_A is inputted to the gate of the 15$^{th}$ NMOS transistor N15, and the first inverted enable signal ENb_A is inputted to the gate of the 16$^{th}$ NMOS transistor N16.

The 17$^{th}$ and the 18$^{th}$ NMOS transistors N17 and N18 are coupled in series between the input terminal of the power source voltage VDD and a node K8. A node coupled between the 15$^{th}$ NMOS transistor N15 and the 16$^{th}$ NMOS transistor N16 is the node K8.

The first enable signal EN_A is inputted to the gate of the 17$^{th}$ NMOS transistor N17, and the first inverted enable signal ENb_A is inputted to the gate of the 18$^{th}$ NMOS transistor N18.

A node coupled between the 17$^{th}$ NMOS transistor N17 and the 18$^{th}$ NMOS transistor N18 is a node K9. The node K9 is coupled to the gate of the eighth NMOS transistor N8.

In FIG. 4C, when the first enable signal EN_A of a high level is received at the select circuit 420, the 15$^{th}$ and the 17$^{th}$ NMOS transistors N15 and N17 are turned on, and the 16$^{th}$ and the 18$^{th}$ NMOS transistors N16 and N18 are turned off.

Accordingly, the voltage VDD−Vth is supplied to the node K8 and the node K9. The voltage Vth is the threshold voltage of each of the 15th and the 17th NMOS transistors N15 and N17.

When the fifth voltage VPP_MAX is supplied to the node K4 with the voltage VDD−Vth being supplied to the node K9, the voltage of the node K9 rises owing to the boosting effect of the first capacitor C1.

Furthermore, when the voltage of the node K9 starts rising and becomes equal to or higher than the power source voltage VDD, the 17th NMOS transistor N17 is turned off, and the node K9 is floated. Furthermore, the voltage of the node K9 is further boosted by the fifth voltage VPP_MAX supplied to the node K4.

The voltage supplied to the gate of the eighth transistor N8 is calculated as follows.

$$V_{(K9)}=(VDD-Vth)+\{C1/(C1+Ct)\}\times VPP\_MAX \quad [\text{Equation 1}]$$

In Equation 1, C1 is the amount of electric charge of the first capacitor C1, and Ct is the amount of electric charge due to a boosting effect.

The eighth NMOS transistor N8 is turned on by the high voltage calculated according to Equation 1, and the first voltage VPP_A is supplied to the global word line GWLn. Furthermore, in order to preclude leakage while the boosting effect of the first capacitor C1 is generated, the 15th NMOS transistor N15 is supplied with, and the node K8 maintains the voltage VDD−Vth. Thus, the voltage VPP_MAX may be higher than the voltage VDD, and the voltage VPP_MAX may be lower than the voltage $V_{(K9)}$.

If the first enable signal EN_A has a low level, the 15th and the 17th NMOS transistors N15 and N17 are turned off, and the 16th and the 18th NMOS transistors N16 and N18 are turned on.

Accordingly, both the node K8 and the node K9 are coupled to the ground node, and the fifth voltage VPP_MAX supplied to the node K4 is fully discharged to the ground node. Accordingly, the eighth NMOS transistor N8 is not turned on.

Figure 5:
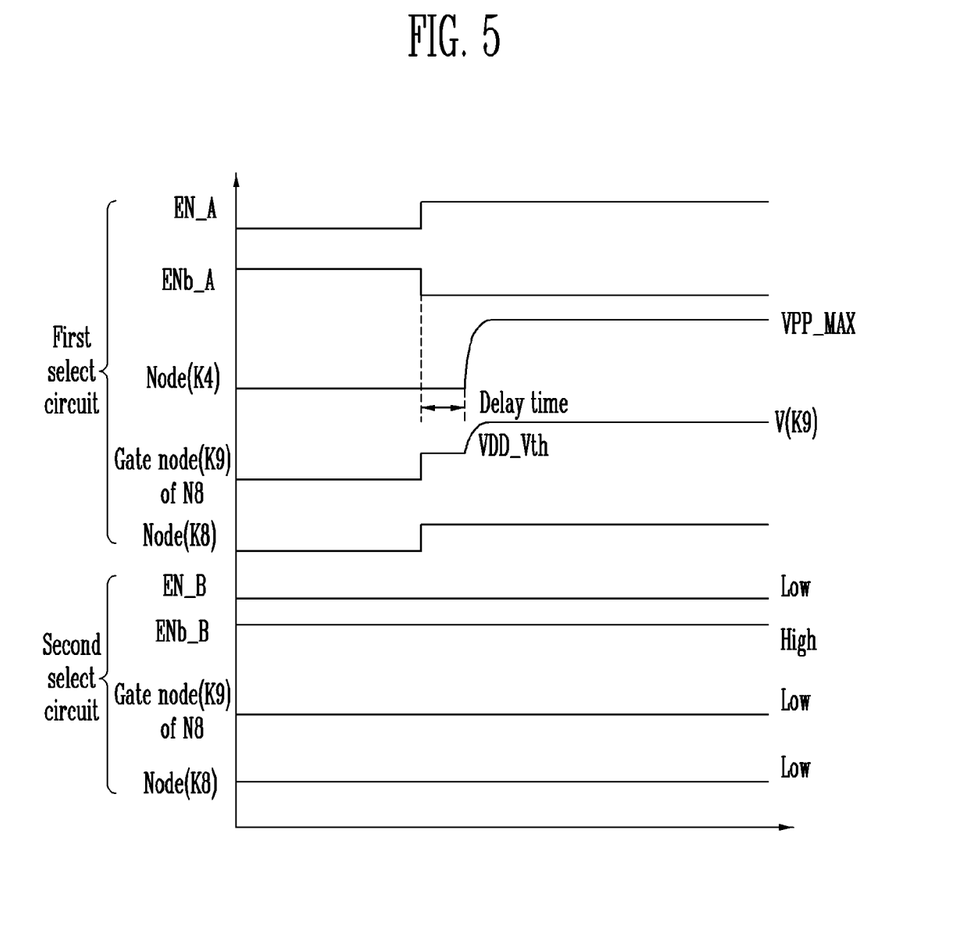
FIG. 5 is a timing diagram illustrating an operation of the voltage select circuit according to an embodiment of this disclosure.

FIG. 5 is a timing diagram illustrating an operation of the voltage select circuit 233 according to an embodiment of this disclosure.

The operation of the voltage select circuit 233 shown in FIGS. 4A to 4C and 5 is described below in connection with the operation of the semiconductor memory device 200 shown in FIGS. 2 and 3.

The voltage supply circuit 230 generates the first to fifth voltages VPP_A to VPP_D and VPP_MAX in response to signals received from the voltage control signal of the controller 220.

Each of the voltage select circuits 233 selects voltage to be supplied to the global word line GWLn in response to the first to fourth enable signals EN_A to EN_D received from the controller 220.

All the first to fourth enable signals EN_A to EN_D may initially have a low level. FIG. 5 shows an example in which only the first and the second select circuits 420 and 430 are operated. This is for describing an example in which the first select circuit 420 selects the first voltage VPP_A to be outputted to the global word line GWLn, but the second select circuit does not select the second voltage VPP_B.

Initially, both the first and the second enable signals EN_A and EN_B may have a low level. Thus, the first and the second inverted enable signals ENb_A and ENb_B have a high level.

Furthermore, the controller 220 changes only the first enable signal EN_A into a high level so that the operating voltage can be transferred to the global word line GWLn.

When the first enable signal EN_A has a high level, the voltage VDD−Vth is supplied to the gate of the eighth NMOS transistor N8. Furthermore, the gate of the ninth NMOS transistor N9 is coupled to the ground node because the second enable signal EN_B has a low level. Thus, the eighth NMOS transistor N8 is turned on, and the ninth NMOS transistor N9 is turned off.

Furthermore, the transfer control circuit 410 starts supplying the fifth voltage VPP_MAX to the node K4 after the first enable signal EN_A is delayed by the delay circuit 411 when the first enable signal EN_A shifts to a high level.

Accordingly, the voltage of the gate of the eighth NMOS transistor N8 is boosted to a voltage level calculated by Equation 1.

The voltage of the gate of the ninth NMOS transistor N9, however, maintains the ground voltage.

While the first enable signal EN_A has a high level, all the second to fourth enable signals EN_B to EN_D have a low level.

The eighth NMOS transistor N8 is turned on, and the ninth to 11th NMOS transistors N9 to N11 are turned off. Accordingly, only the first voltage VPP_A is transferred to the global word line GWLn.

The transfer control circuit for transferring a selected voltage precharges the gate of a transistor for transferring the selected voltage to the global word line with a specific voltage. The amount of electric charge of the capacitor coupled between the gate of the transistor and the switching control circuit is boosted by voltage supplied by the switching control circuit, so that the voltage of the gate of the transistor can be raised and the transistor can be turned on.

In an embodiment of this disclosure, the operating voltages are assumed to include only the first to fourth voltages VPP_A to VPP_D. If the number of operating voltages is increased, however, a circuit, such as the first select circuit 420, a capacitor, and a transfer transistor have only to be added.

From the viewpoint of circuit area, the select circuit 420 of FIG. 4C includes much fewer electrical elements than all the switching control circuits shown in FIG. 1B. Accordingly, the voltage select circuit can be configured according to the addition of an operating voltage by only adding a circuit having a much smaller area.

The voltage select circuit 233 according to another embodiment may be configured as follows.

Figure 6A:
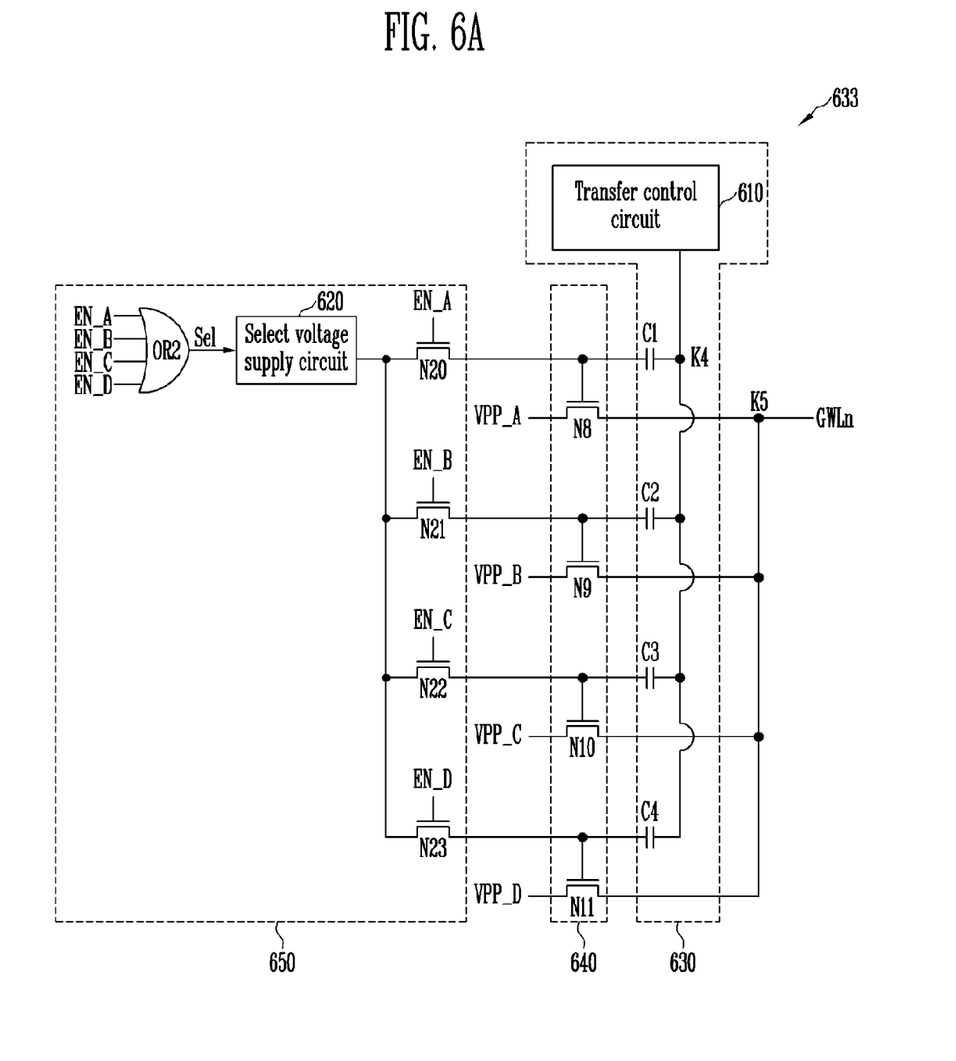
FIG. 6A shows a voltage select circuit according to another embodiment of this disclosure.

FIG. 6A shows a voltage select circuit according to another embodiment of this disclosure.

Referring to FIG. 6A, the voltage select circuit 633 includes a transfer control circuit 610, eighth to 11th NMOS transistors N8 to N11, 20th to 23rd NMOS transistors N20 to N23, first to fourth capacitors C1 to C4, a select voltage supply circuit 620, and a second OR gate OR2.

The transfer control circuit 610 has a substantially similar construction as the transfer control circuit 410 of FIG. 4B.

Accordingly, the transfer control circuit 610 and the first to fourth capacitors C1 to C4 form a second control circuit 630 having a substantially similar function as the first control circuit 460 of FIG. 4A.

Furthermore, the eighth to 11th NMOS transistors N8 to N11 form a transfer transistor 640 having a substantially similar function as the transfer transistor 470 of FIG. 4A.

Furthermore, the second OR gate OR2, the select voltage supply circuit 620, and the 20th to 23rd NMOS transistors N20 to N23 form a select circuit 650 having a substantially similar function as the select circuit group 480 of FIG. 4A.

When comparing the embodiment of FIG. 4A with the embodiment of FIG. 6A, the first control circuit 460 and the second control circuit 630 have a substantially similar construction, and the select circuit group 480 and the select circuit 650 may have different constructions, but perform the same function. The first to fourth capacitors C1 to C4 and the eighth to 11$^{th}$ NMOS transistors N8 to N11 have the same reference numerals shown in FIGS. 4A and 6A.

The second OR gate OR2 generates a select signal Sel by performing an OR operation on the first to fourth enable signals EN_A, EN_B, EN_C, and EN_D. In the OR operation, when any one of input signals has a high level, a signal of a high level is outputted. Thus, when of the first to fourth enable signals EN_A to EN_D has a high level, the select signal Sel of a high level is outputted.

The select voltage supply circuit 620 has a similar construction to the first select circuit 420 of FIG. 4C, but differs from the first select circuit 420 in that the select voltage supply circuit 620 receives the select signal Sel and Sel_b, while the select circuit 420 receives enable signals EN_A and ENb_A.

Figure 6B:
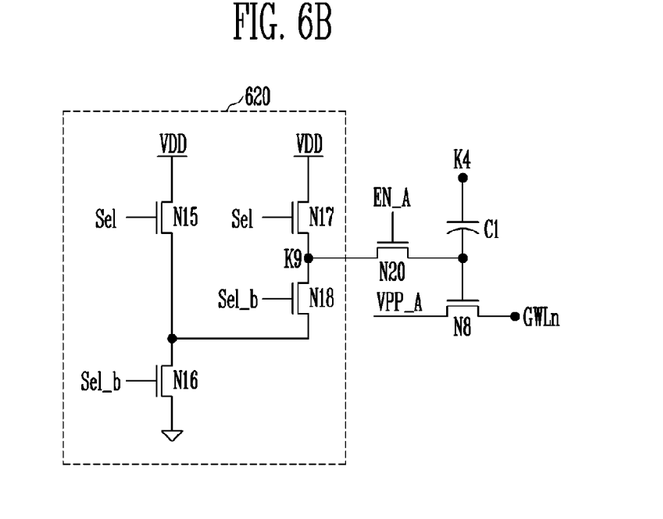
FIG. 6B shows a select voltage supply circuit of FIG. 6A.

FIG. 6B shows the select voltage supply circuit 620 of FIG. 6A.

Referring to FIG. 6B, the select voltage supply circuit 620 has a similar construction and function as the first select circuit 420 of FIG. 4C. As described above, however, in the select voltage supply circuit 620, the select signal Sel is inputted instead of the first enable signal EN_A, and an inverted select signal Sel_b is inputted instead of the first inverted enable signal ENb_A.

Referring again to FIG. 6A, in response to the first to fourth enable signals EN_A to EN_D, the 20$^{th}$ to 23$^{rd}$ NMOS transistors N20 to N23 transfer the output of the select voltage supply circuit 620 to the gates of the eighth to 11$^{th}$ NMOS transistors N8 to N11, respectively.

The second OR gate OR2 outputs the select signal Sel by performing an OR operation on the first to fourth enable signals EN_A to EN_D. In order to transfer an operating voltage to the global word line GWLn, one of the first to fourth enable signals EN_A to EN_D must be received with a high level. Accordingly, when the operating voltage is transferred to the global word line GWLn, the select signal Sel has a high level.

Thus, the output voltage of the select voltage supply circuit 620 becomes the voltage VDD−Vth described with reference to FIG. 4C.

Assuming that the first enable signal EN_A of a high level is supplied, the 20$^{th}$ NMOS transistor N20 is turned on. Accordingly, the output voltage of the select voltage supply circuit 620 is transferred to the gate of the eighth NMOS transistor N8.

Furthermore, when the voltage of the node K4 is supplied to the first capacitor C1, the voltage of the gate of the eighth NMOS transistor N8 rises, and the 20$^{th}$ NMOS transistor N20 is turned off. Thus, the voltage of the gate of the eighth NMOS transistor N8 is boosted to a high voltage. Accordingly, the eighth NMOS transistor N8 is turned on, and the first voltage VPP_A is transferred to the node K5. That is, the first voltage VPP_A is supplied to the global word line GWLn.

If the voltage select circuit 633 is configured as in FIG. 6A, the configuration of the circuit can be reduced because only one circuit that is similar to the first to fourth select circuits 420 to 450 shown in FIG. 4C is necessary.

Figure 7:
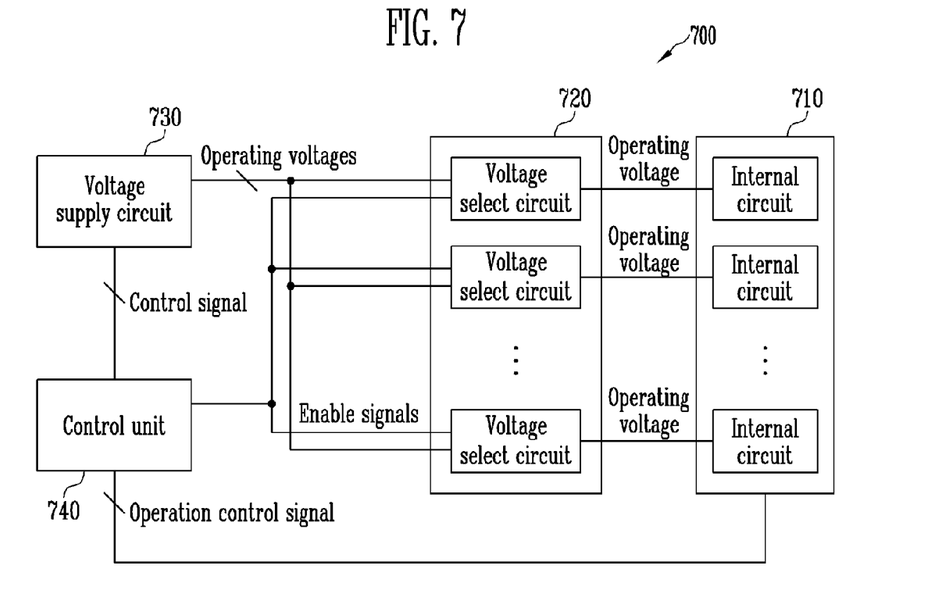
FIG. 7 shows an integrated circuit to which the voltage select circuit is applied according to an embodiment of this disclosure.

FIG. 7 shows an integrated circuit to which the voltage select circuit is applied according to an embodiment of this disclosure.

Referring to FIG. 7, the integrated circuit 700 includes an internal circuit group 710 configured to include a plurality of internal circuits, a voltage select circuit group 720 configured to supply operating voltages to the internal circuits, a voltage supply circuit 730 configured to supply operating voltages necessary for the internal circuit group 710, and a control unit 740 configured to control operations of the voltage supply circuit 730, the voltage select circuit group 720, and the internal circuit group 710.

The internal circuits of the internal circuit group 710 may be configured in various ways depending on the types of integrated circuits. Furthermore, the voltage select circuit group 720 includes a plurality of voltage select circuits coupled to respective internal circuits. The voltage select circuits may be configured in a substantially similar manner as in embodiments depicted herein.

The voltage supply circuit 730 generates operating voltages in response to the control signal of the control unit 740. The operating voltages generated from the voltage supply circuit 730 are supplied to the voltage select circuits of the voltage select circuit group 720.

The control unit 740 supplies enable signals for selecting the respective operating voltages that are supplied to the voltage select circuits.

Each of the voltage select circuits selects at least one operating voltage in response to each of the enable signals and outputs the selected operating voltage to a corresponding internal circuit.

The internal circuits perform respective operations suitable for the circuits in response to the operation control signal of the control unit 740 and the operating voltages of the voltage select circuits.

Although the number of internal circuits of the internal circuit group 710 is increased because the number of operating voltages is increased, an increase of a circuit area occupied by each voltage select circuit can be minimized by constructing the voltage select circuits in accordance with the embodiments of this disclosure.

As described above, in accordance with this disclosure, the circuit area of the voltage select circuit can be reduced by reducing the number of high voltage switches necessary for the voltage select circuit that selects one of operating voltages.

What is claimed is:
1. A voltage select circuit, comprising:
a plurality of first transfer elements configured to transfer respective operating voltages to a first output terminal;
a transfer select circuit unit configured to output a first voltage necessary to transfer an operating voltage, selected from among the operating voltages, to at least one first transfer element in response to a plurality of enable signals; and
a control circuit configured to boost the first voltage to a second voltage in response to the plurality of enable signals,
wherein the control circuit comprises:
a first OR operation unit configured to generate a result signal by performing an OR operation on the plurality of enable signals and generate an output signal by delaying the result signal for a predetermined period;
a voltage supply unit configured to output a third voltage or a ground voltage to a second output terminal in response to the output signal of the first OR operation unit, where the third voltage is higher than the first voltage, but lower than the second voltage; and
a plurality of boosting units coupled between respective first transfer elements and the second output terminal and configured to boost the first voltage, supplied to the first transfer element, to the second voltage by using the third voltage.

2. The voltage select circuit of claim 1, wherein the first OR operation unit comprises:
  a first OR gate configured to generate the result signal; and
  a delay circuit configured to generate the output signal by delaying the result signal of the first OR gate,
  wherein the voltage supply unit comprises:
    an inverter configured to generate an inverted signal by inverting the output signal; and
    a voltage supply circuit configured to output the third voltage or the ground voltage to the second output terminal in response to the output signal of the first OR operation unit and the inverted signal of the inverter,
  wherein each of the boosting units comprises a capacitor.

3. The voltage select circuit of claim 2, wherein the voltage supply circuit comprises:
  a first switching element coupled between an output terminal of the delay circuit and the second output terminal and turned on in response to the output signal of the delay circuit;
  a second switching element coupled between the second output terminal and a ground node of the ground voltage and turned on in response to the inverted signal of the inverter; and
  third and fourth switching elements coupled in series between an input terminal to which the third voltage is inputted and the second output terminal,
  wherein the third switching element is turned on in response to a signal of the second output terminal,
  the fourth switching element is turned on in response to the inverted signal of the inverter,
  the first to third switching elements are turned on in response to a signal of a high level, and
  the fourth switching element is turned on in response to a signal of a low level.

4. The voltage select circuit of claim 3, wherein the transfer select circuit unit comprises a plurality of transfer select circuits for supplying the first voltage or the ground voltage to at least one first transfer element in response to the respective enable signals.

5. The voltage select circuit of claim 4, wherein each of the transfer select circuits comprises:
  fifth and sixth switching elements coupled in series between an input terminal of a power source voltage and the ground node, wherein the fifth switching element is turned on in response to the enable signal and the sixth switching element is turned on in response to an inverse enable signal of the enable signal; and
  seventh and eighth switching elements coupled in series between the input terminal of the power source voltage and a node of the fifth and the sixth switching elements, wherein the seventh switching element is turned on in response to the enable signal, and the eighth switching element is turned on in response to the inverse enable signal of the enable signal,
  wherein the first voltage or the ground voltage is transferred to the first transfer element through a node of the seventh and the eighth switching elements.

6. The voltage select circuit of claim 3, wherein the transfer select circuit unit comprises:
  a second OR gate configured to generate a select signal by performing an OR operation on the plurality of enable signals;
  a select voltage supply circuit configured to output the first voltage to a third output terminal in response to the select signal;
  second transfer elements configured to transfer the first voltage to a respective first transfer element in response to the plurality of enable signals.

7. The voltage select circuit of claim 6, wherein the select voltage supply circuit comprises:
  ninth and tenth switching elements coupled in series between an input terminal of a power source voltage and the ground node, wherein the ninth switching element is turned on in response to the enable signal and the tenth switching element is turned on in response to an inverse enable signal of the enable signal; and
  eleventh and twelfth switching elements coupled in series between the input terminal of the power source voltage and a node of the ninth and the tenth switching elements, wherein the eleventh switching element is turned on in response to the enable signal, and the twelfth switching element is turned on in response to the inverse enable signal of the enable signal,
  wherein a node of the eleventh and the twelfth switching elements is coupled to the third output terminal.

8. The voltage select circuit of claim 1, wherein each of the first transfer elements is a transistor for transferring a high voltage.

9. An integrated circuit, comprising:
  internal circuits operated in response to an operation control signal and respective operating voltages selected from among a plurality of operating voltages;
  voltage select circuits coupled to respective internal circuits and configured to select the operating voltages to be supplied to the respective internal circuits in response to the plurality of operating voltages and a plurality of enable signals,
  wherein each of the voltage select circuits comprises:
    a plurality of first transfer elements configured to transfer the respective operating voltages to a first output terminal coupled to the internal circuits;
    a transfer select circuit unit configured to output a first voltage for transferring an operating voltage, selected from among the plurality of operating voltages, to at least one first transfer element which transfers the selected operating voltage in response to a plurality of enable signals; and
    a control circuit configured to boost the first voltage to a second voltage in response to the plurality of enable signals,
  wherein the control circuit comprises:
    a first OR operation unit configured to generate a result signal by performing an OR operation on the plurality of enable signals and generate an output signal by delaying the result signal for a predetermined time period;
    a voltage supply unit configured to output a third voltage or a ground voltage to a second output terminal in response to the output signal of the first OR operation unit, where the third voltage is higher than the first voltage, but lower than the second voltage; and
    a plurality of boosting units coupled between respective first transfer elements and the second output terminal and configured to boost the first voltage, supplied to the first transfer element, to the second voltage by using the third voltage.

10. The voltage select circuit of claim 9, wherein the first OR operation unit comprises:
  a first OR gate configured to generate the result signal; and
  a delay circuit configured to generate the output signal by delaying the result signal of the first OR gate, wherein the voltage supply unit comprises:
an inverter configured to generate an inverted signal by inverting the output signal; and
a voltage supply circuit configured to output the third voltage or the ground voltage to the second output terminal in response to the output signal of the first OR operation unit and the inverted signal of the inverter,
wherein each of the boosting units comprises a capacitor.

11. The integrated circuit of claim 10, wherein the voltage supply circuit comprises:
a first switching element coupled between an output terminal of the delay circuit and the second output terminal and turned on in response to the output signal of the delay circuit;
a second switching element coupled between the second output terminal and a ground node of the ground voltage and turned on in response to the inverted signal of the inverter; and
third and fourth switching elements coupled in series between an input terminal to which the second voltage is inputted and the second output terminal, wherein the third switching element is turned on in response to an output signal of the second output terminal, and the fourth switching element is turned on in response to the inverted signal of the inverter,
wherein the first to third switching elements are turned on in response to a signal of a high level, and
the fourth switching element is turned on in response to a signal of a low level.

12. The integrated circuit of claim 11, wherein the transfer select circuit unit comprises a plurality of select circuits for supplying the first voltage to a gate of the first transfer element in response to the respective enable signals.

13. The integrated circuit of claim 12, wherein each of the select circuits comprises:
fifth and sixth switching elements coupled in series between an input terminal of a power source voltage and the ground node, wherein the fifth switching element is turned on in response to the enable signal and the sixth switching element is turned on in response to an inverse enable signal of the enable signal; and
seventh and eighth switching elements coupled in series between the input terminal of the power source voltage and a node of the fifth and the sixth switching elements, wherein the seventh switching element is turned on in response to the enable signal, and the eighth switching element is turned on in response to the inverse enable signal of the enable signal,
wherein the first voltage or the ground voltage is transferred to the first transfer element through a node of the seventh and the eighth switching elements.

14. The integrated circuit of claim 11, wherein the transfer select circuit unit comprises:
a second OR gate configured to generate a select signal by performing an OR operation on the plurality of enable signals;
a select voltage supply circuit configured to output the first voltage to a third output terminal in response to the select signal;
second transfer elements configured to transfer the first voltage to a respective first transfer element in response to the plurality of enable signals.

15. The integrated circuit of claim 14, wherein the select voltage supply circuit comprises:
ninth and tenth switching elements coupled in series between an input terminal of a power source voltage and the ground node, wherein the ninth switching element is turned on in response to the enable signal and the tenth switching element is turned on in response to an inverse enable signal of the enable signal; and
eleventh and twelfth switching elements coupled in series between the input terminal of the power source voltage and a node of the ninth and the tenth switching elements, wherein the eleventh switching element is turned on in response to the enable signal, and the twelfth switching element is turned on in response to the inverse enable signal of the enable signal,
wherein a node of the eleventh and the twelfth switching elements is coupled to the third output terminal.

16. The integrated circuit of claim 9, wherein each of the first transfer elements is a transistor for transferring a high voltage.

17. A voltage select circuit comprising:
a transfer select circuit configured to receive a plurality of enable signals and output a first voltage necessary to transfer an operating voltage to a first output terminal, wherein the operating voltage is selected from among a plurality of operating voltages on the basis of the plurality of enable signals;
a control circuit configured to boost the first voltage to a second voltage in response to the plurality of enable signals; and
a plurality of first transfer elements configured to transfer respective operating voltages to the first output terminal,
wherein the control circuit comprises:
a first OR operation unit configured to generate a result signal by performing an OR operation on the plurality of enable signals and generate an output signal by delaying the result signal for a predetermined time period;
a voltage supply unit configured to output a third voltage or a ground voltage to a second output terminal in response to the output signal of the first OR operation unit, where the third voltage is higher than the first voltage, but lower than the second voltage; and
a plurality of boosting units coupled between respective first transfer elements and the second output terminal and configured to boost the first voltage, supplied to the first transfer element, to the second voltage by using the third voltage.

18. The voltage select circuit of claim 17, wherein the first OR operation unit comprises:
a first OR gate configured to generate the result signal; and
a delay circuit configured to generate the output signal by delaying the result signal of the first OR gate,
wherein the voltage supply unit comprises:
an inverter configured to generate an inverted signal by inverting the output signal; and
a voltage supply circuit configured to output the third voltage or the ground voltage to the second output terminal in response to the output signal of the first OR operation unit and the inverted signal of the inverter,
wherein each of the boosting units comprises a capacitor.

19. The voltage select circuit of claim 17, where the transfer select circuit comprises:
a second OR gate configured to generate a select signal by performing an OR operation on the plurality of enable signals;
a select voltage supply circuit configured to output the first voltage to a third output terminal in response to the select signal;

second transfer elements configured to transfer the first voltage to a respective first transfer element in response to the plurality of enable signals.

\* \* \* \* \*